United States Patent
Derat et al.

(10) Patent No.: US 10,903,916 B1
(45) Date of Patent: Jan. 26, 2021

(54) MEASUREMENT SYSTEM AND CORRESPONDING METHOD FOR INVESTIGATING THE RECEIVE BEHAVIOR OF A DEVICE UNDER TEST

(71) Applicant: Rohde & Schwarz GmbH & Co. KG, Munich (DE)

(72) Inventors: Benoit Derat, Munich (DE); Gerhard Hamberger, Griesstatt (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/458,813

(22) Filed: Jul. 1, 2019

(51) Int. Cl.
  *H04W 24/00* (2009.01)
  *H04B 17/00* (2015.01)
  *H04B 17/20* (2015.01)

(52) U.S. Cl.
  CPC .................................... *H04B 17/20* (2015.01)

(58) Field of Classification Search
  CPC ..... H04W 24/00; H04W 24/02; H04W 24/06; H04W 24/08; H04W 24/10; H04B 17/0085; H04B 17/15; H04B 17/19; H04B 17/20; H04B 17/27; H04B 17/29; H04B 17/309; H04B 17/318
  See application file for complete search history.

(56) References Cited

U.S. PATENT DOCUMENTS

| | | | | |
|---|---|---|---|---|
| 8,525,744 | B2* | 9/2013 | Teshirogi | H04B 17/21 343/703 |
| 9,024,828 | B2* | 5/2015 | Reed | H04B 17/3912 455/67.12 |
| 9,337,941 | B2* | 5/2016 | Emerson | H04B 17/102 |
| 9,964,577 | B2* | 5/2018 | Qi | H04B 17/29 |
| 10,012,683 | B2* | 7/2018 | Qi | H04B 17/102 |
| 10,333,631 | B2* | 6/2019 | Rowell | H04B 17/0085 |
| 10,416,214 | B2* | 9/2019 | Qi | G01R 29/0821 |
| 10,440,539 | B2* | 10/2019 | Nikitin | H04W 4/70 |
| 10,768,216 | B2* | 9/2020 | Abadie | H04W 24/08 |
| 2019/0393968 | A1* | 12/2019 | Ioffe | H04B 17/101 |

FOREIGN PATENT DOCUMENTS

KR  101958311 B1  3/2019

\* cited by examiner

*Primary Examiner* — Quochien B Vuong
(74) *Attorney, Agent, or Firm* — Ditthavong & Steiner P.C.

(57) ABSTRACT

A measurement system for investigating the receive behavior of a device under test is provided. The measurement system comprises a test antenna, a test equipment connected to the test antenna, and a test position with respect to the device under test. In this context, the test equipment is configured to derive from geometrical information and radiation pattern data of the test antenna position based signal properties for transmitting via the test antenna.

17 Claims, 2 Drawing Sheets

MEASUREMENT SYSTEM AND CORRESPONDING METHOD FOR INVESTIGATING THE RECEIVE BEHAVIOR OF A DEVICE UNDER TEST

TECHNICAL FIELD

The invention relates to a measurement system for investigating the receive behavior of a device under test and a corresponding measurement method.

BACKGROUND ART

Generally, in times of an increasing number of applications providing wireless communication capabilities, there is a growing need of a measurement system and a measurement method for investigating the receive behavior of a device under test comprising such an application in order to verify correct functioning of said applications in a highly accurate and efficient manner. For example, we make reference to KR 10-1958311 B1.

Unfortunately, neither a measurement system for investigating especially the receive behavior of a device under test nor a corresponding measurement method focusing on the investigation of the receive behavior of a device under test is known.

Accordingly, there is a need to provide a measurement system and a measurement method for investigating the receive behavior of a device under test, whereby both a high accuracy and a high efficiency are ensured.

SUMMARY OF THE INVENTION

According to a first aspect of the invention, a measurement system for investigating the receive behavior of a device under test is provided. The measurement system comprises a test antenna, a test equipment connected to the test antenna, and a test position with respect to the device under test. In this context, the test equipment is configured to derive from geometrical information and radiation pattern data of the test antenna position based signal properties for transmitting via the test antenna. Advantageously, for instance, the receive behavior of the device under test can be investigated in a highly accurate and efficient manner.

According to a first preferred implementation form of the first aspect of the invention, the test antenna position and the test position move relatively to each other during measurement. Advantageously, for example, this allows for more than one measurement, thereby increasing measurement efficiency.

According to a second preferred implementation form of the first aspect of the invention, the measurement system further comprises a holder. In this context, the holder is configured to hold the device under test. Advantageously, for instance, the device under test can be arranged in an accurate and efficient manner.

According to a further preferred implementation form of the first aspect of the invention, the measurement system further comprises a positioner. In this context, the positioner is configured to position the device under test. Advantageously, for example, the device under test can be moved or positioned in an accurate and efficient manner.

According to a further preferred implementation form of the first aspect of the invention, the signal properties comprise signal power. Advantageously, for instance, complexity can be reduced, thereby increasing efficiency.

According to a further preferred implementation form of the first aspect of the invention, the test antenna is configured to move around the device under test in a sphere-shaped manner. Advantageously, for example, accuracy can further be increased.

According to a further preferred implementation form of the first aspect of the invention, the test equipment comprises radiation pattern data with respect to the radiation pattern. Advantageously, for instance, efficiency can further be increased.

According to a further preferred implementation form of the first aspect of the invention, the measurement system or the test equipment further comprises a memory, wherein the memory is configured to store radiation pattern data with respect to the radiation pattern. Advantageously, for example, radiation pattern data can directly be provided, thereby increasing efficiency.

According to a further preferred implementation form of the first aspect of the invention, the measurement system or the test equipment further comprises an input, wherein the input is configured to receive the geometrical information from a user. Advantageously, for instance, complexity can further be reduced, thereby increasing efficiency.

According to a further preferred implementation form of the first aspect of the invention, the test equipment comprises the geometrical information. Advantageously, for example, efficiency can further be increased.

According to a further preferred implementation form of the first aspect of the invention, the measurement system or the test equipment further comprises a memory, wherein the memory is configured to store the geometrical information. Advantageously, for instance, geometrical information can directly be provided, thereby increasing efficiency.

According to a further preferred implementation form of the first aspect of the invention, the measurement system or the test equipment is configured to request the geometrical information from a network or the internet. Advantageously, for example, efficiency can further be increased.

According to a further preferred implementation form of the first aspect of the invention, the geometrical information comprises information with respect to the test antenna position and the test position. Advantageously, for instance, accuracy can further be increased.

According to a further preferred implementation form of the first aspect of the invention, the radiation pattern comprises a radiation pattern with respect to the test antenna and/or the device under test. Advantageously, for example, accuracy can further be increased.

According to a second aspect of the invention, a measurement method for investigating the receive behavior of a device under test is provided. The measurement method comprises the steps of providing a test antenna connected to a test equipment and a test position with respect to the device under test, and deriving from geometrical information and radiation pattern data of the test antenna position based signal properties for transmitting via the test antenna to the device under test. Advantageously, for instance, the receive behavior of the device under test can be investigated in a highly accurate and efficient manner.

According to a first preferred implementation form of the second aspect of the invention, the measurement method further comprises the step of moving the test antenna position and the test position relatively to each other during measurement. Advantageously, for example, this allows for more than one measurement, thereby increasing measurement efficiency.

According to a second preferred implementation form of the second aspect of the invention, the signal properties comprise signal power. Advantageously, for instance, complexity can be reduced, thereby increasing efficiency.

According to a further preferred implementation form of the second aspect of the invention, the measurement method further comprises the step of moving around the device under test in a sphere-shaped manner. Advantageously, for example, accuracy can further be increased.

According to a further preferred implementation form of the second aspect of the invention, the geometrical information comprises information with respect to the test antenna position and the test position. Advantageously, for instance, accuracy can further be increased.

According to a further preferred implementation form of the second aspect of the invention, the radiation pattern comprises a radiation pattern with respect to the test antenna and/or the device under test. Advantageously, for example, measurement accuracy can further be increased.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
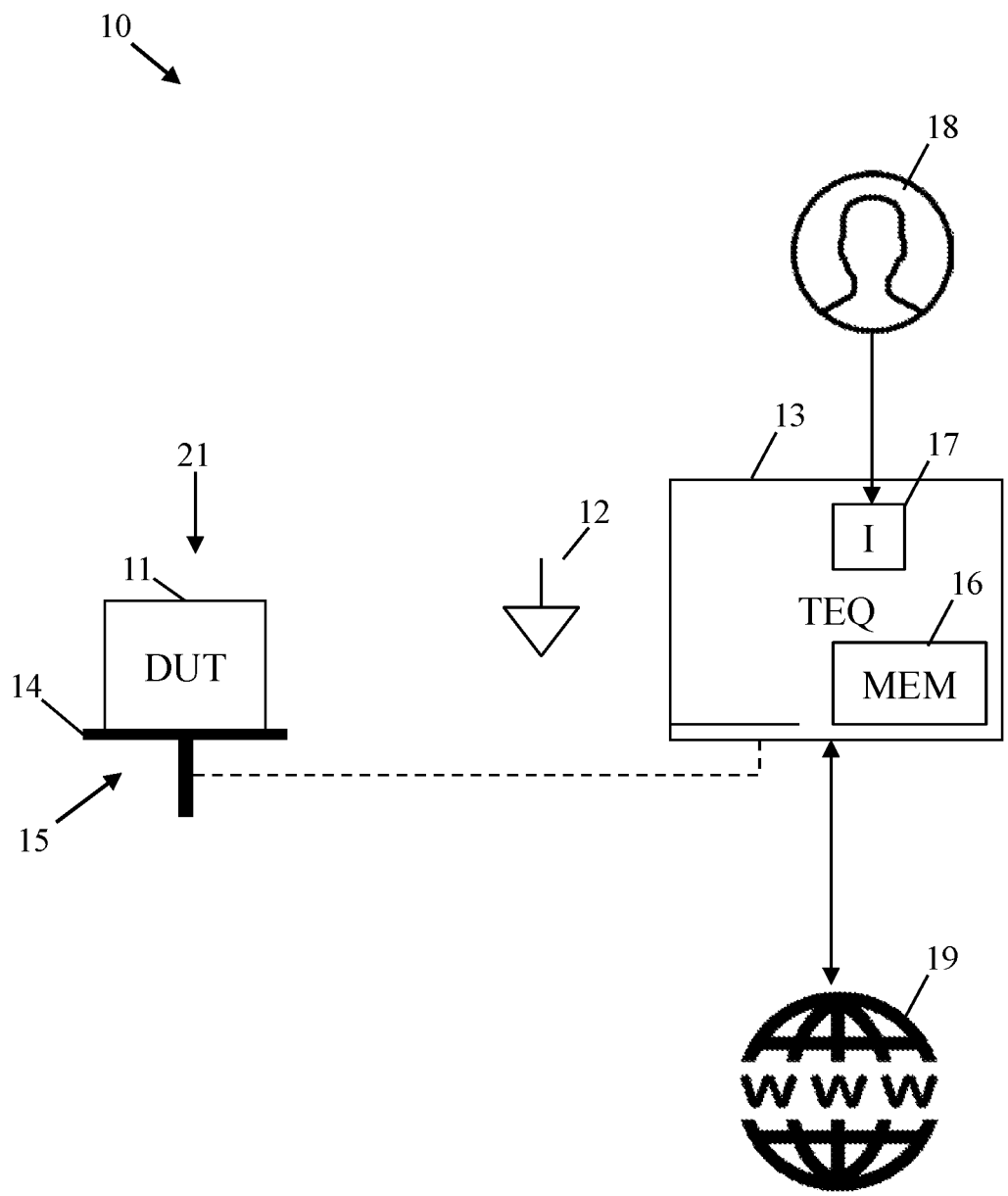
FIG. 1 shows an exemplary embodiment of the first aspect of the invention.

Firstly, FIG. 1 illustrates an exemplary embodiment of the inventive measurement system 10 for investigating the receive behavior of a device under test 11. Said measurement system 10 comprises a test antenna 12, a test equipment 13 connected to the test antenna 12, and a test position 21 with respect to the device under test 11.

In this context, the test equipment 13 derives from geometrical information and radiation pattern data of the test antenna position based signal properties for transmitting via the test antenna 12. It is further noted that the test antenna position and the test position 21 move relatively to each other during a measurement.

As it can further be seen from FIG. 1, the measurement system 10 further comprises a holder 14, wherein the holder 14 holds the device under test 11.

In addition to this, the measurement system 10 further comprises a positioner 15, wherein the positioner 15 positions the device under test 11 especially in accordance with the above-mentioned relative movement during a measurement.

Furthermore, the positioner 15 may be connected to the test equipment 13. In this context, the test equipment 15 may control the positioner 15. Alternatively, the measurement system 10 may control the positioner 15.

With respect to the above-mentioned signal properties, it is noted that it might be particularly advantageous if the signal properties comprise signal power.

In addition to this or as an alternative, the test antenna 12 may preferably move around the device under test 11 in a sphere-shaped manner.

As it can further be seen from FIG. 1, the test equipment 13 further comprises a memory 16, wherein the memory stores radiation pattern data with respect to the radiation pattern.

It is noted that said memory 16 may additionally or alternatively store the above-mentioned geometrical information.

It is further noted that as an alternative to the test equipment 13 comprising the memory 16, the measurement system 10 may comprise the memory 16.

Moreover, the test equipment 13 further comprises an input 17, wherein the input 17 receives the geometrical information from a user 18. In this context, it is noted that said input 17 may additionally or alternatively receive radiation pattern data with respect to the radiation pattern. It is further noted that as an alternative to the test equipment 13 comprising the input 17, the measurement system 10 may comprise the input 17.

Furthermore, as it can exemplarily be seen, the test equipment 13 requests the geometrical information from a network or the internet 19. Additionally or alternatively, the test equipment 13 may request radiation pattern data with respect to the radiation pattern from a network or the internet 19.

It is further noted that as an alternative to requesting the geometrical information and/or the radiation pattern data with respect to the radiation pattern with the aid of the test equipment 13, the measurement system 10 may request said information and data.

With respect to the geometrical information, it is noted that the geometrical information especially comprises information with respect to the test antenna position and the test position 21. With respect to the radiation pattern, the radiation pattern especially comprises a radiation pattern with respect to the test antenna 12 and/or the device under test 11.

Figure 2:
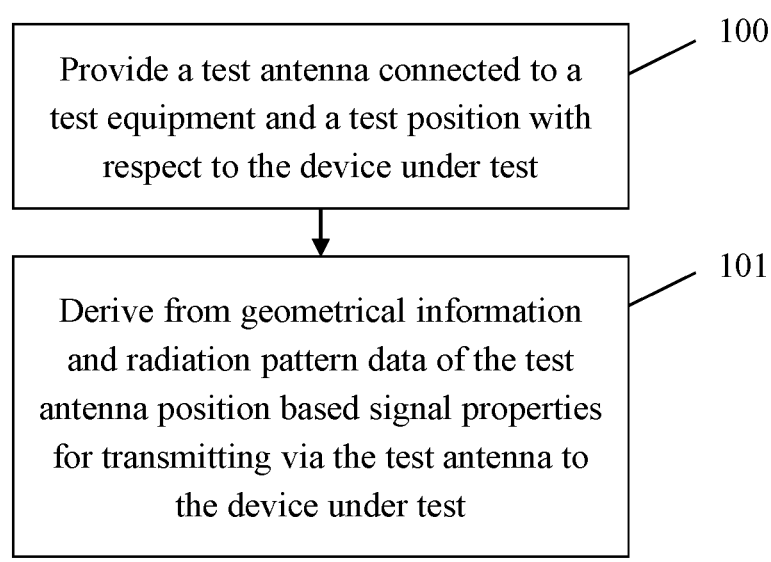
FIG. 2 shows a flow chart of an exemplary embodiment of the second aspect of the invention.

Finally, FIG. 2 shows a flow chart of an exemplary embodiment of the inventive measurement method for investigating the receive behavior of a device under test. In a first step 100, a test antenna connected to a test equipment and a test position with respect to the device under test are provided. Then, in a second step 101, from geometrical information and radiation pattern, data of the test antenna position based signal properties are derived for transmitting via the test antenna to the device under test.

In this context, it might be particularly advantageous if the measurement method further comprises the step of moving the test antenna position and the test position relatively to each other during measurement. Furthermore, the measurement method may further comprise the step of holding the device under test especially with the aid of a holder.

Moreover, the measurement method may further comprise the step of positioning the device under test especially with the aid of a positioner. It is noted that it might be particularly advantageous if the above-mentioned signal properties comprise signal power.

Further advantageously, the measurement method may comprise the step of moving the test antenna around the device under test in a sphere-shaped manner.

Furthermore, the test equipment may advantageously comprise radiation pattern data with respect to the radiation pattern. In addition to this or as an alternative, the measurement method may further comprise the step of storing radiation pattern data with respect to the radiation pattern especially with the aid of a memory.

Further additionally or further alternatively, the measurement method may advantageously comprise the step of receiving the geometrical information from a user especially with the aid of an input. It is further noted that the test equipment may advantageously comprise the geometrical information.

Moreover, it might be particularly advantageous if the measurement method further comprises the step of storing the geometrical information especially with the aid of a memory, preferably with the aid of the above-mentioned memory. In addition to this or as an alternative, the measurement method may comprise the step of requesting the geometrical information from a network or the internet.

Further advantageously, it is noted that the measurement method may additionally or alternatively comprise the step of requesting the radiation pattern from a network or the internet. In this context, it is further noted that this may analogously apply to the inventive measurement system.

With respect to the geometrical information, it is noted that the geometrical information may comprise information with respect to the test antenna position and the test position.

With respect to the radiation pattern, it is noted that the radiation pattern may comprise a radiation pattern with respect to the test antenna and/or the device under test.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system for investigating the receive behavior of a device under test, the measurement system comprising:
    a test antenna,
    a test equipment connected to the test antenna, and
    a test position with respect to the device under test,
    wherein the test equipment is configured to derive from geometrical information and radiation pattern data of the test antenna position based signal properties for transmitting via the test antenna,
    wherein the test antenna is configured to move around the device under test in a sphere-shaped manner, and
    wherein the test equipment further comprises an input, wherein the input is configured to receive the geometrical information and the radiation pattern data from a user.

2. The measurement system according to claim 1, wherein the test antenna position and the test position move relatively to each other during measurement.

3. The measurement system according to claim 1, wherein the measurement system further comprises a holder, wherein the holder is configured to hold the device under test.

4. The measurement system according to claim 1, wherein the measurement system further comprises a positioner, wherein the positioner is configured to position the device under test.

5. The measurement system according to claim 1, wherein the signal properties comprise signal power.

6. The measurement system according to claim 1, wherein the test equipment comprises radiation pattern data with respect to the radiation pattern.

7. The measurement system according to claim 1, wherein the measurement system or the test equipment further comprises a memory, wherein the memory is configured to store radiation pattern data with respect to the radiation pattern.

8. The measurement system according to claim 1, wherein the test equipment comprises the geometrical information.

9. The measurement system according to claim 1, wherein the measurement system or the test equipment further comprises a memory, wherein the memory is configured to store the geometrical information.

10. The measurement system according to claim 1, wherein the measurement system or the test equipment is configured to request the geometrical information from a network or the internet.

11. The measurement system according to claim 1, wherein the geometrical information comprises information with respect to the test antenna position and the test position.

12. The measurement system according to claim 1, wherein the radiation pattern comprises a radiation pattern with respect to the test antenna and/or the device under test.

13. A measurement method for investigating the receive behavior of a device under test, the measurement method comprising the steps of:
    providing a test antenna connected to a test equipment and a test position with respect to the device under test, and
    deriving from geometrical information and radiation pattern data of the test antenna position based signal properties for transmitting via the test antenna to the device under test,
    wherein the test antenna is configured to move around the device under test in a sphere-shaped manner, and
    wherein the test equipment comprises an input, wherein the input is configured to receive the geometrical information and the radiation pattern data from a user.

14. The measurement method according to claim 13, wherein the measurement method further comprises the step of moving the test antenna position and the test position relatively to each other during measurement.

15. The measurement method according to claim 13, wherein the signal properties comprise signal power.

16. The measurement method according to claim 13, wherein the geometrical information comprises information with respect to the test antenna position and the test position.

17. The measurement method according to claim 13, wherein the radiation pattern comprises a radiation pattern with respect to the test antenna and/or the device under test.

* * * * *